(12) United States Patent
Chang et al.

(10) Patent No.: US 9,142,915 B2
(45) Date of Patent: Sep. 22, 2015

(54) ELECTRICAL CONTACT AND ELECTRICAL CONNECTOR USED THEREOF

(71) Applicant: HON HAI PRECISION INDUSTRY CO., LTD., New Taipei (TW)

(72) Inventors: Yen-Chih Chang, New Taipei (TW); Wei-Hung Hsu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 52 days.

(21) Appl. No.: 14/028,562

(22) Filed: Sep. 17, 2013

(65) Prior Publication Data

US 2014/0080330 A1  Mar. 20, 2014

(30) Foreign Application Priority Data

Sep. 17, 2012  (TW) .............................. 101217891 U (51) Int. Cl.
| | |
|---|---|
| H01R 13/627 | (2006.01) |
| H01R 13/24 | (2006.01) |
| H01R 13/41 | (2006.01) |
| H05K 7/10 | (2006.01) |

(52) U.S. Cl.
CPC .......... *H01R 13/627* (2013.01); *H01R 13/2442* (2013.01); *H01R 13/2485* (2013.01); *H01R 13/41* (2013.01); *H05K 7/1069* (2013.01)

(58) Field of Classification Search
CPC .. H01R 12/714; H01R 13/2435; H01R 12/58; H01R 12/7076
USPC ............................................................ 439/66
See application file for complete search history.

(56) References Cited

U.S. PATENT DOCUMENTS

| | | | |
|---|---|---|---|
| 6,932,619 B2 * | 8/2005 | Chen ................................ 439/66 |
| 2003/0068906 A1 * | 4/2003 | Light et al. ....................... 439/66 |
| 2007/0155196 A1 * | 7/2007 | Cheng et al. ..................... 439/66 |
| 2008/0124957 A1 * | 5/2008 | Liao et al. ........................ 439/83 |
| 2013/0267104 A1 * | 10/2013 | Chang et al. ..................... 439/68 |
| 2014/0045350 A1 * | 2/2014 | Taylor .............................. 439/66 |

* cited by examiner

*Primary Examiner* — Truc Nguyen
(74) *Attorney, Agent, or Firm* — Wei Te Chung; Ming Chieh Chang (57) ABSTRACT

An electrical contact (2) for electrically connecting an IC package having solder balls (4) with a substrate and includes a base portion (21), a spring arm (24) extending upwardly from the base portion (21) and a rear portion (23) extending downwardly from the base portion (21), the spring arm (24) defines a contact portion (25) at the end thereof to connect with the solder ball (4) of the IC package, the contact portion (25) includes a wide portion (252) with a width larger than other portions of the contact portion (25), the wide portion (252) includes a pair of higher end portions (2520) at opposite ends thereof and a lower middle portion (2521) between the pair of end portions (2520).

20 Claims, 7 Drawing Sheets

ELECTRICAL CONTACT AND ELECTRICAL CONNECTOR USED THEREOF

BACKGROUND OF THE INVENTION

1. Field of the Invention

The present invention relates to an electrical contact for connecting with an IC package, and more particularly to an electrical contact with improved contact portion to establish robust electrical connection between the electrical contact and the IC package.

2. Description of Related Art

U.S. Pat. No. 7,097,463 issued to Hsiao on Aug. 29, 2006 discloses a conventional electrical connector for electrically connecting an IC package with a substrate. The electrical connector includes an insulative housing and a plurality of electrical contacts received in the insulative housing. Each of the electrical contacts comprises a main portion received in the insulative housing, a soldering portion extending downwardly from the main portion and a contact portion extending upwardly from the main portion. The soldering portion is used to be soldered to the substrate through a solder ball. The contact portion is used to contact with the solder ball of the IC package. When the IC package is assembled to the electrical connector, the solder ball of the IC package press the contact portion, thus a robust electrical connection is established between the IC package and the electrical connector. Due to the solder ball is configured with a circular shape, when the solder ball presses the contact portion, the solder ball is easy to slide away from the contact portion of the electrical contact. Thus, the electrical connection between the IC package and the electrical connector is disconnected.

Hence, it is desirable to provide an improved electrical connector to overcome the aforementioned disadvantages.

SUMMARY OF THE INVENTION

Accordingly, an object of the present invention is to provide an electrical contact with improved contact portion to establish robust electrical connection between the electrical contact and the IC package.

According to one aspect of the present invention, an electrical contact for electrically connecting an IC package having solder balls with a substrate and includes a base portion, a spring portion extending upwardly from the base portion and a rear portion extending downwardly from the base portion, the spring portion defines a contact portion at the end thereof to connect with the solder ball of the IC package, the contact portion includes a wide portion with a width larger than other portions of the contact portion, the wide portion includes a pair of higher end portions at opposite ends thereof and a lower middle portion between the pair of end portions.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
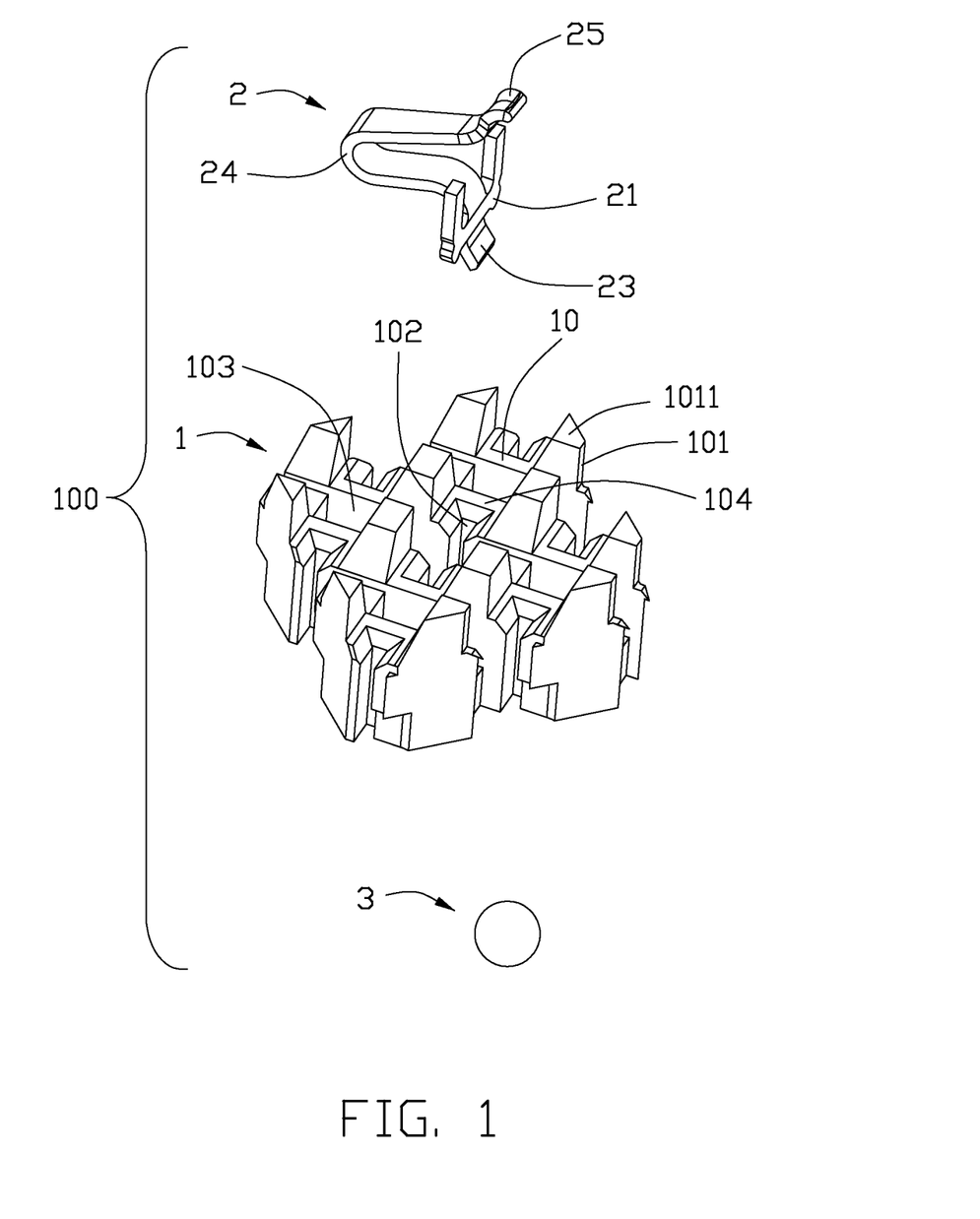
FIG. 1 is an exploded view of an electrical connector according to a preferred embodiment of the present invention.
Figure 7:
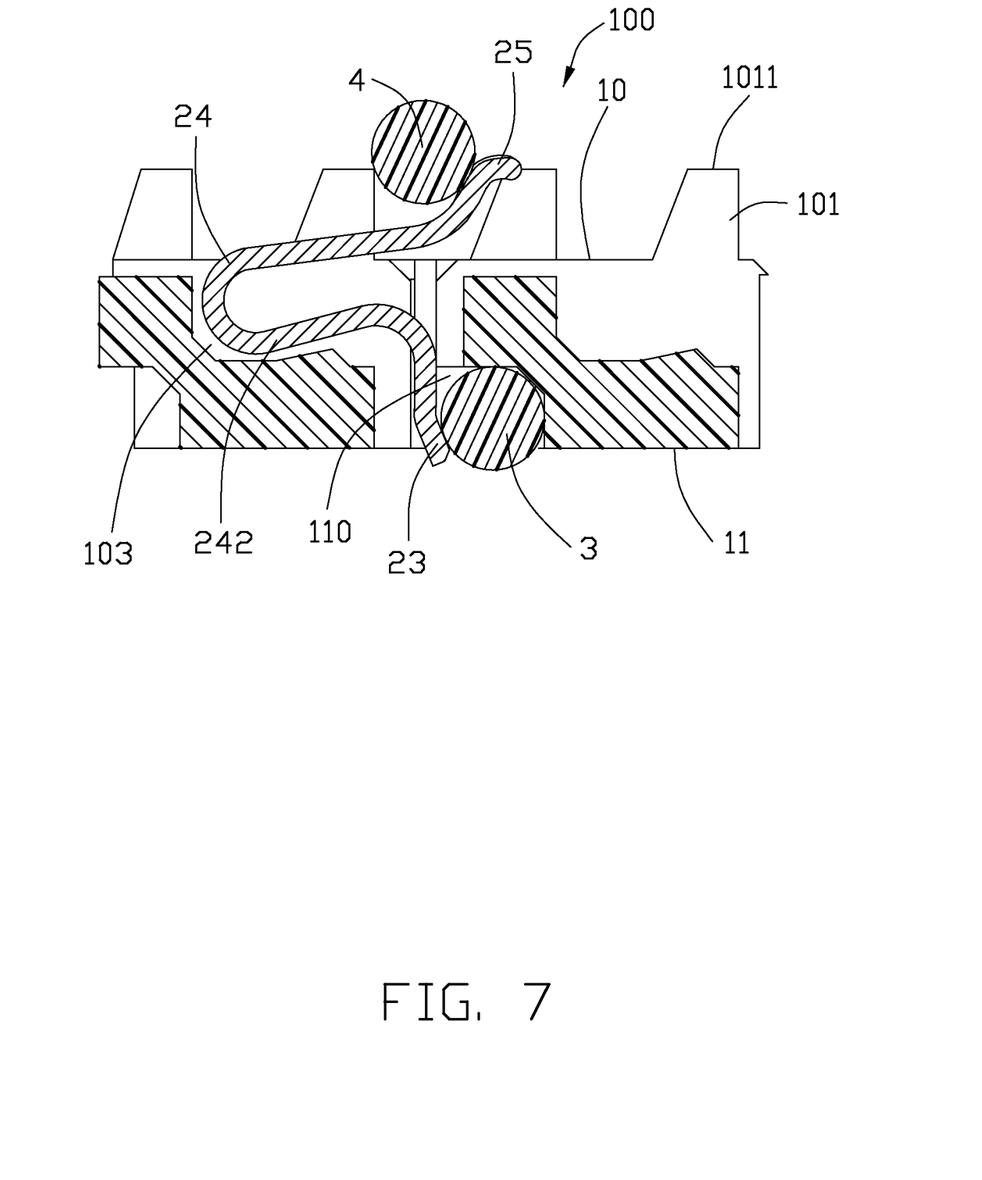
FIG. 7 is a cross-sectional view of the electrical connector along line 7-7 shown in FIG. 3, showing the electrical contact is pressed by solder ball of an IC package.

FIGS. 1 and 7 illustrates an electrical connector 100 in accordance to a preferred embodiment of the present invention, the electrical connector 100 is used for electrically connecting an IC package (not labeled) having solder balls 4 with a substrate (not labeled). The electrical connector 100 comprises an insulative housing 1 with a plurality of electrical contacts 2 and soldering members 3 received therein.

Figure 5:
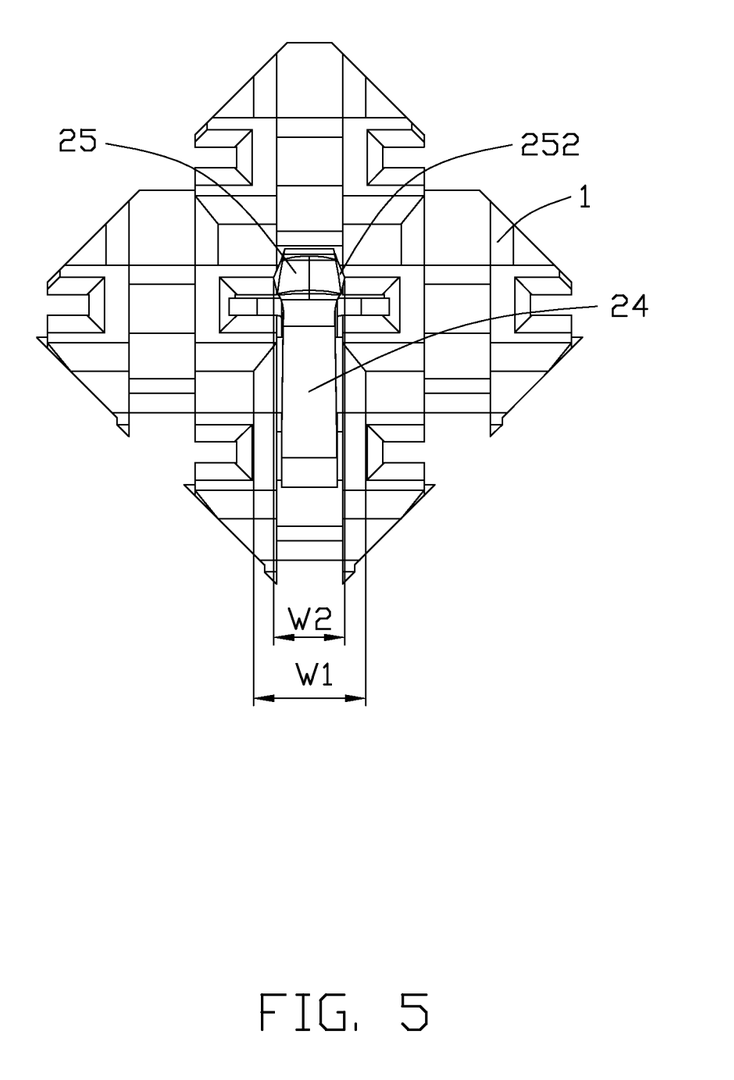
FIG. 5 is a top view of the electrical connector as shown in FIG. 4.
Figure 6:
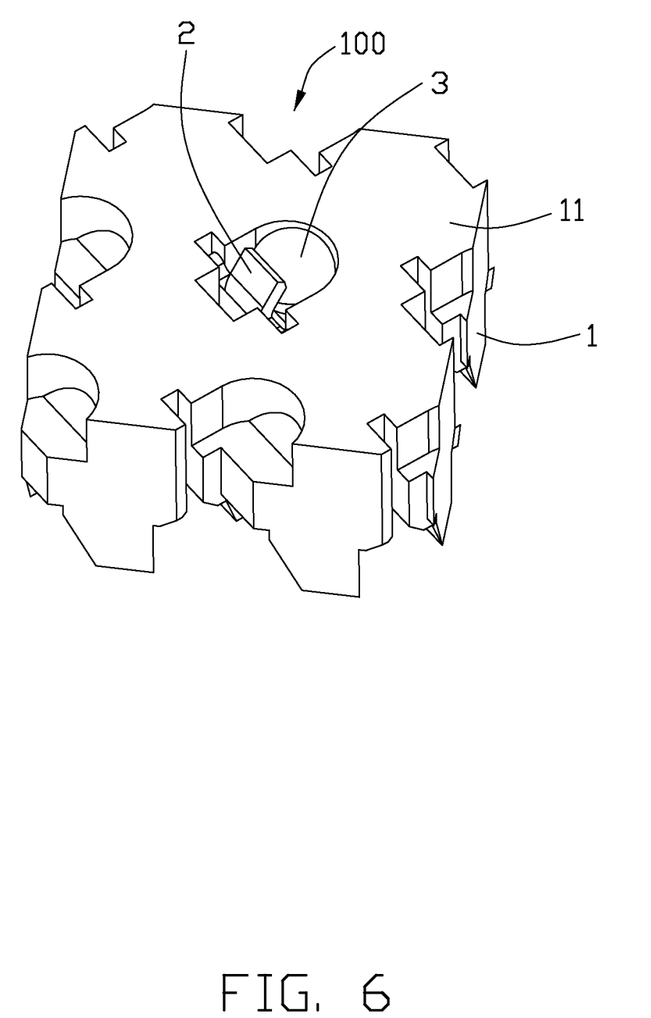
FIG. 6 is bottom view of the electrical connector as shown in FIG. 4.

The insulative housing 1 comprises a top surface 10, a bottom surface 11 opposite to the top surface 10 and a plurality of through holes 102 penetrating the top surface 10 and the bottom surface 11. The insulative housing 1 further comprises a plurality of rows of protruding members 101 extending upwardly from the top surface 10, a plurality of recesses 103 recessed from the top surface 10 to inner of the insulative housing 1 and a plurality of receiving holes 110 recessed from the bottom surface 11 to inner of the insulative housing 1. The recess 103 locates near the through hole 102 and connects with the through hole 102. The soldering members 3 are received in the receiving holes 110 respectively. There are four protruding members 101 around each through hole 102. The four protruding members 101 form a receiving space 104 for receiving the solder ball 4 of the IC package. Referring to FIG. 5, the protruding member 101 includes an upper surface 1011. The distance between two protruding members 101 in two adjacent rows is defined as W1. The receiving hole 110 and the recess 103 locate on opposite sides of the through hole 102.

Figure 2:
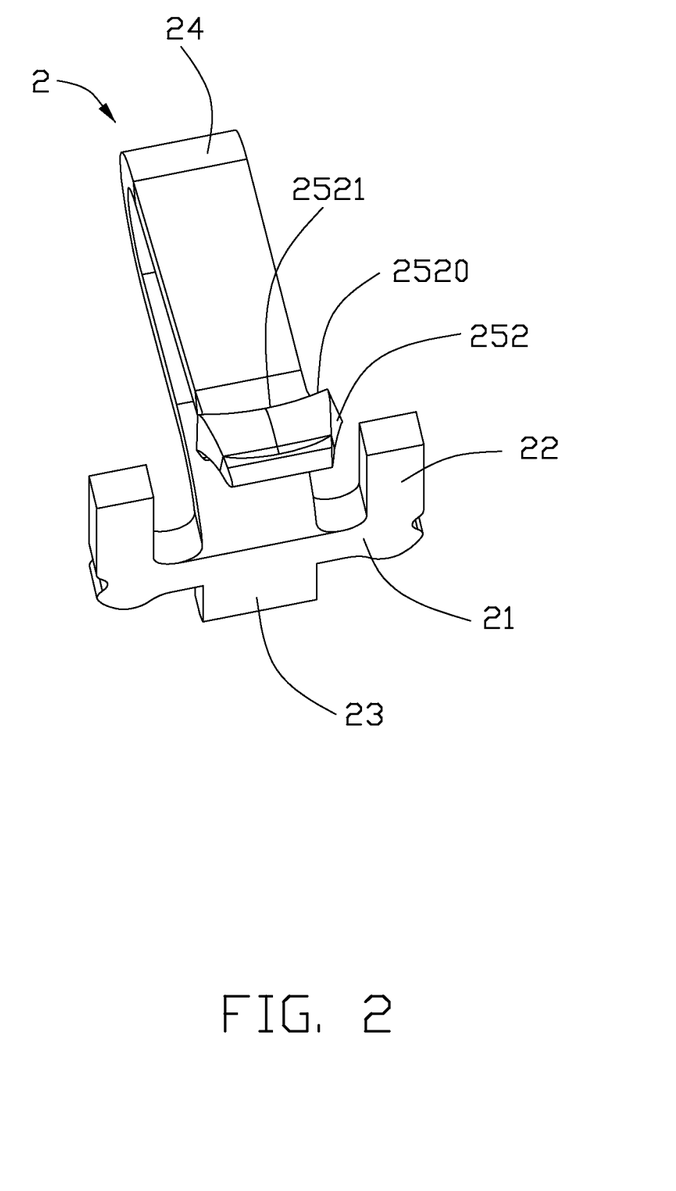
FIG. 2 is an isometric view of the electrical contacts of the electrical connector as shown in FIG. 1.
Figure 3:
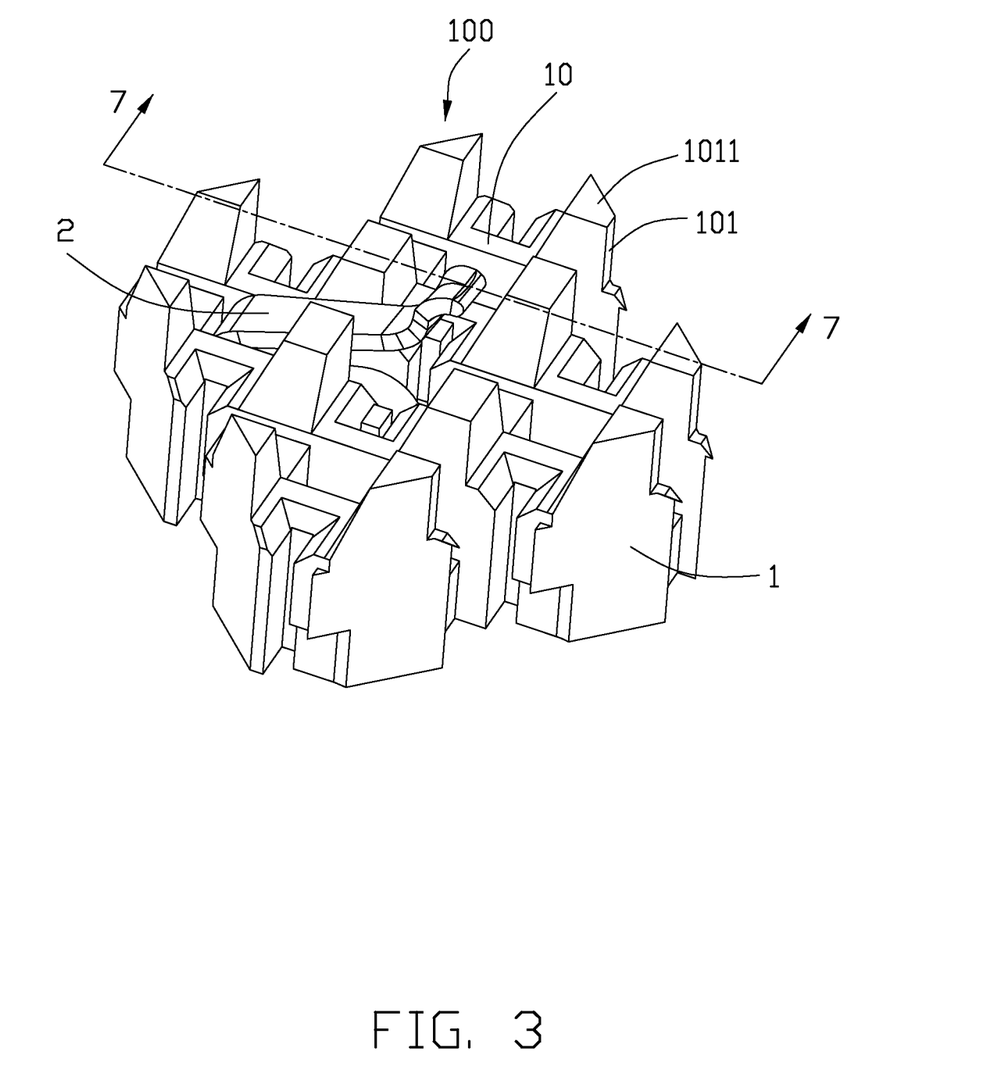
FIG. 3 is an assembled view of the electrical connector as shown in FIG. 1.
Figure 4:
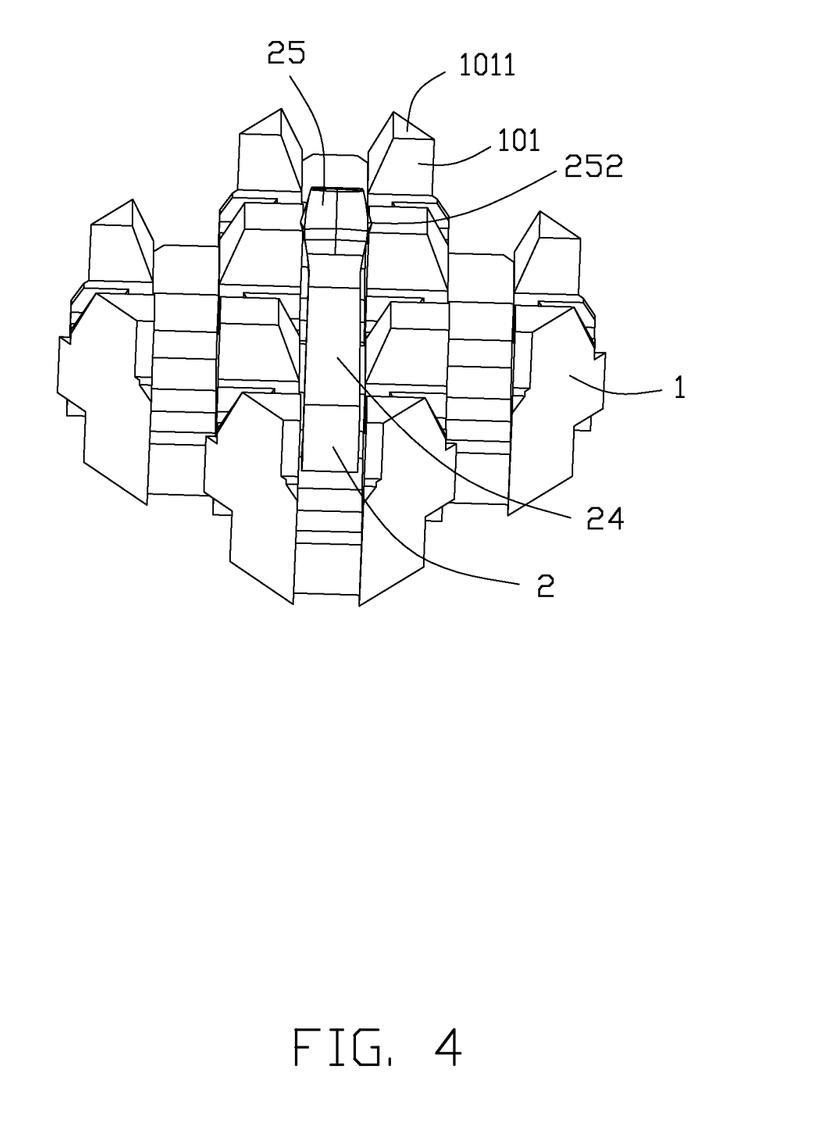
FIG. 4 is another view of the electrical connector as shown in FIG. 3.

Referring to FIG. 2 and FIG. 7, the electrical contacts 2 are received in the through holes 102 respectively, and each electrical contact 2 comprises a base portion 21, a pair of retention portions 22 extending upwardly from opposite ends of the base portion 21, a rear portion 23 extending downwardly from the base portion 21 and a spring arm 24 extending upwardly from middle of the base portion 21. There is a distance between the spring arm 24 and the pair of retention portions 22. The spring arm 24 is configured with a U shape and first extends away from the base portion 21 and then extends toward the base portion 21. The spring arm 24 defines a sustain portion 242 can be supported by the insulative housing 1 and a contact portion 25 at the end thereof to contact with the solder ball 4 of the IC package. The contact portion 25 is configured with an arc shape and comprises a wide portion 252 has a width larger than other portions of the contact portion 25. Referring to FIG. 5, the wide portion 252 locates between two adjacent rows of protruding members 101 of the insulative housing 1. The width of the wide portion 252 is defined as W2. In this embodiment, W2 is 0.7 times of W1. The wide portion 252 includes a pair of higher end portions 2520 at opposite ends thereof and a lower middle portion 2521 between the pair of end portions 2520. Thus, when the solder ball 4 of the IC package presses the contact portion 25, the solder ball 4 will not break away from the contact portion 25, and a robust electrical connector is established between the IC package and the electrical connector 100.

Referring to FIGS. 3-7, when the electrical connector 100 is assembled, the electrical contacts 2 receive in the through holes 101 of the insulative housing 1, respectively; the spring arm 24 of the electrical contact 2 receives in the recess 103 of the insulative housing 1; the soldering members 3 receive in the receiving holes 110 of the insulative housing 1, respectively; the rear portion 23 is bend toward the soldering member 3, thus the soldering members 3 are fixed to the insulative housing 1 by clamped by the rear portion 23 and the insulative housing 1. The contact portion 25 extends beyond the upper surface 1011 of the protruding member 101. When the IC package press the electrical contact 2, the spring arm 24 deformed to establish a robust electrical connection between the IC package and the electrical connector 100.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical contact for electrically connecting an IC package having solder balls with a substrate, comprising:
    a base portion;
    a spring arm extending upwardly from the base portion, the spring arm including a contact portion at the end thereof to connect with the solder ball of the IC package, the contact portion including a wide portion with a width larger than other portions of the contact portion, the wide portion including a pair of higher end portions at opposite ends thereof and a lower middle portion between the pair of end portions; and
    a rear portion extending downwardly from the base portion; wherein
    the spring arm is configured with a U shape and first extends away from the base portion and then extends toward the base portion.

2. The electrical contact as claimed in claim 1, wherein the electrical contact further comprises a pair of retention portions extending upwardly from opposite ends of the base portion and there is a distance between the spring arm and the pair of retention portions.

3. An electrical connector for electrically connecting an IC package having solder balls with a substrate, comprising:
    an insulative housing;
    a plurality of electrical contacts received in the insulative housing, each of the electrical contacts including a base portion, a spring arm extending upwardly from the base portion and a rear portion extending downwardly from the base portion, the spring arm including a contact portion at the end thereof to connect with a solder ball of the IC package, the contact portion including a wide portion with a width larger than other portions of the contact portion, the wide portion including a pair of higher end portions at opposite ends thereof and a lower middle portion between the pair of end portions; wherein
    the electrical contact further comprises a pair of retention portions extending upwardly from opposite ends of the base portion and there is a distance between the spring arm and the pair of retention portions.

4. The electrical connector as claimed in claim 3, wherein the spring arm is configured with a U shape and first extends away from the base portion and then extends toward the base portion.

5. The electrical connector as claimed in claim 3, wherein the insulative housing comprises a top surface, a bottom surface opposite to the top surface, a plurality of through holes penetrating the top surface and the bottom surface, a plurality of recesses recessed from the top surface to inner of the insulative housing, the recess locates near the through hole and connects with the through hole, the electrical contacts are received in the through hole and the spring arms are received in the recesses respectively.

6. The electrical connector as claimed in claim 5, wherein the spring arm defines a sustain portion which can be supported by the insulative housing.

7. The electrical connector as claimed in claim 5, wherein the insulative housing further comprises a plurality of rows of protruding members extending upwardly from the top surface of the insulative housing, there are four protruding members around each through hole and the four protruding members form a receiving space for receiving the solder ball of the IC package.

8. The electrical connector as claimed in claim 7, wherein the wide portion locates between two adjacent rows of protruding members of the insulative housing, each of the protruding members includes an upper surface at the top thereof, the width of the wide portion is 0.7 times of the distance of two protruding members in two adjacent rows.

9. The electrical connector as claimed in claim 5, wherein insulative housing further includes a plurality of receiving holes recessed from the bottom surface to inner of the insulative housing, the electrical connector further includes a plurality of soldering members received in the receiving holes respectively.

10. The electrical connector as claimed in claim 9, wherein the rear portion is bend toward the soldering member, the rear portion and the insulative housing together to clamp the soldering members.

11. The electrical connector as claimed in claim 10, wherein the receiving hole and the recess locate on opposite sides of the through hole.

12. An electrical connector assembly comprising:
    an insulative housing defining a plurality of passageways extending therethrough between opposite upper and bottom faces of the housing in a vertical direction;
    plural pairs of protrusions formed on the upper face, each pair of protrusions located around the corresponding passageway;
    a plurality of contacts disposed in the corresponding passageways, respectively, each of said contacts defining an obliquely extending spring arm with a contact portion at a distal upper end of the spring arm, each pair of protrusions defining a channel therebetween through which the spring arm of the corresponding contact extend in an up and down movable manner, the contact portion located beside the corresponding pair of protrusions and being moveable in both a vertical direction and a first transverse direction perpendicular to said vertical direction; and
    an electronic package seated upon the housing and having a plurality of solder balls thereunder; wherein
    each of solder balls is retained between the contact portion and the corresponding pair of protrusions in said first transverse direction, and also between the pair of protrusions in a second transverse direction perpendicular to said first transverse direction.

13. The electrical connector assembly as claimed in claim 12, wherein the contact portion defines a first width larger than a second width defined by said spring arm.

14. The electrical connector assembly as claimed in claim 13, wherein the channel defines a third width which is larger than the second width while smaller than the first width.

15. The electrical connector assembly as claimed in claim 14, wherein the contact portion is curved in a transverse cross-sectional.

16. The electrical connector assembly as claimed in claim 12, wherein the spring arm defines a U-shaped configuration extending from a base portion which is essentially located under the contact portion in the vertical direction.

17. The electrical connector assembly as claimed in claim 12, wherein each protrusion defines a vertical surface as a stopper to confront the corresponding solder ball, and an oblique surface opposite to said vertical surface for reinforcement of the protrusion.

18. The electrical connector assembly as claimed in claim 12, wherein the housing further defined a plurality of recesses in the bottom face to receive corresponding solder elements for soldering to a mother board, and the contact defines a rear portion to abut against the corresponding solder element, and engagement between the solder ball and the contact portion and abutment between the solder element and the rear portion interact with each other.

19. The electrical connector assembly as claimed in claim 12, wherein each of said contacts includes a pair of retention portions between which said spring arm is located, and in each of said passageways, a pair of holes are formed to receive the pair of retention portions of the corresponding contact.

20. The electrical connector assembly as claimed in claim 19, wherein said contacts are arranged in matrix defined by rows and columns, and the pair of retention portions of the contacts in one row are offset, in a row direction, from those of a neighboring row.

\* \* \* \* \*